United States Patent [19]
Asai et al.

[11] Patent Number: 5,393,444
[45] Date of Patent: Feb. 28, 1995

[54] PIEZOELECTRIC SEMICONDUCTOR

[75] Inventors: Yuji Asai, Chita; Osamu Imai, Kasugai, both of Japan

[73] Assignee: NGK Insulators, Ltd., Nagoya, Japan

[21] Appl. No.: 112,529

[22] Filed: Aug. 27, 1993

[30] Foreign Application Priority Data

Sep. 8, 1992 [JP] Japan ................................. 4-239651
Sep. 8, 1992 [JP] Japan ................................. 4-239652
Sep. 8, 1992 [JP] Japan ................................. 4-239653
Mar. 29, 1993 [JP] Japan ................................. 5-070416

[51] Int. Cl.$^6$ ............................................. H01L 41/18
[52] U.S. Cl. ............................ 252/62.3 ZT; 252/62.9; 423/622
[58] Field of Search ..................... 252/62.3 ZT, 62.9; 423/622

[56] References Cited

FOREIGN PATENT DOCUMENTS 358078  3/1990  European Pat. Off. .

OTHER PUBLICATIONS

"Hydrothermal Growth and Stoichiometric Assessment of ZnO Single Crystals of High Purity," Noboru Sakagami, Res. Rep. of Akita National College of Technology 23 (1988) pp. 25–29, no month.
"The Hydrothermal Growth of Low Carrier Concentration ZnO at High Water and Hydrogen Pressures," E. D. Kolb, A. S. Coriell, R. A. Laudise and A. R. Hutson (Bell Telephone Lab), Mat. Res. Bull. 2 (1967) pp. 1099–1106, no month.
"Hydrothermal Growth of Large Sound Crystals of Zinc Oxide," R. A. Laudise, E. D. Kolb, A. J. Caporaso (Bell Telephone Lab), J. Amer. Ceram. Soc. 46 (1964) pp. 9–12, no month.

*Primary Examiner*—Jack Cooper
*Attorney, Agent, or Firm*—Adduci, Mastriani, Schaumberg & Schill

[57] ABSTRACT

A piezoelectric semiconductor is a single crystal composed mainly of ZnO having properties such as electrical conductivity of $10^{-11} \sim 10^{-3}$ 1/$\Omega$·cm suitable for use as an acoustoelectric element, by adding a given amount of $H_2O_2$ to the alkali solvent, or by using $NH_4OH$ in the alkali solvent, or by doping the ZnO single crystal with Li or a trivalent metal. The piezoelectric semiconductor can be suitably used as a ultrasonic transducer material of acoustoelectric type and can also be used as a material for ultrasonic amplification, an surface acoustic wave filter, a piezoelectric transducer, a fluorescent material for emitting a low-velocity electron beam, etc.

8 Claims, 3 Drawing Sheets

ID SEMICONDUCTOR

BACKGROUND OF THE INVENTION AND RELATED ART STATEMENT

The present invention relates to a piezoelectric semiconductor comprising a single crystal composed mainly of ZnO. More particularly, the present invention relates to a piezoelectric semiconductor which can be suitably used, for example, as an acoustoelectric element for ultrasonic transducers.

ZnO provides an n type semiconductor wherein Zn is present in excess, and further has drawn attention as a piezoelectric material because of its crystal structure.

With respect to the production of a single crystal of high-purity ZnO, there is a literature of "Hydrothermal Growth and Stoichiometric Assessment of ZnO Single Crystals of High Purity" (Noboru Sakagami, Feb. 1988, Research Reports of Akita National College of Technology No. 23). This literature describes the growth of ZnO single crystal by a hydrothermal process. In this process, sintered ZnO is placed at the bottom of an apparatus for crystal growth and ZnO seed crystals are placed at the top of the apparatus; then a solvent, i.e. an aqueous alkali solution containing KOH and LiOH (the solvent is hereinafter referred to as alkali solvent) is fed into the apparatus; in this state, the apparatus inside is placed under the conditions of 370°–400° C. and 700–1,000 kg/cm$^2$ with the temperature of the apparatus bottom kept 10°–15° C. higher than the temperature of the apparatus top, to grow a single crystal of ZnO.

In the above process, since only the alkali solvent is used as asolvent for crystal growth and the environment for crystal growth is a reducing atmosphere, the amount of excess Zn atoms present in the ZnO single crystal formed is over 10 ppm to over 20 ppm and the electrical conductivity of said single crystal is as high as $10^{-2} \sim 10^0$ 1/Ω·cm. Hence, it was tried to add $H_2O_2$ to make the growth system under a partial pressure of oxygen to produce a ZnO single crystal of higher purity. As a result, it was found that the ZnO single crystal obtained by $H_2O_2$ addition has an electrical conductivity of as low as $10^{-10} \sim 10^{-8}$ 1/Ω·cm. In the case of $H_2O_2$ addition, however, since $H_2O_2$ is a strong oxidizing agent, the vessel for crystal growth must be made of platinum or the inside of said vessel must be lined with platinum, making the process disadvantageous costwise.

As mentioned above, ZnO has drawn attention as a piezoelectric material. However, no sufficient study has been made on ZnO as an acoustoelectric material and the above-mentioned production of ZnO single crystal is merely for using the ZnO type single crystal as a piezoelectric material.

The present inventor made a study on the application of ZnO single crystal as an acoustoelectric material by examining the absorption coefficient and acoustoelectric voltage (hereinafter referred to as AE voltage). As a result, the present inventor found that a ZnO single crystal produced by a conventional process, having an electrical conductivity of $10^{-2} \sim 10^0$ 1/Ω·cm is not suitable as an acoustoelectric material, particularly an acoustoelectric element for ultrasonic transducers and that a ZnO single crystal having a certain electrical conductivity, etc. is suitable for said application.

The present inventor further found that a ZnO single crystal having an electrical conductivity of $10^{-2} \sim 10^0$ 1/Ω·cm, which is not suitable as an acoustoelectric element, can be made into a suitable acoustoelectric element by applying thereto a post-treatment using Li.

The present inventor furthermore found that a ZnO single crystal having an electrical conductivity of $10^{-10} \sim 10^{-8}$ 1/Ω·cm can be made into a very suitable acoustoelectric element by applying thereto a post-treatment using a trivalent metal.

Hence, the objects of the present invention are to provide a piezoelectric semiconductor having properties (e.g. electrical conductivity) suitable for use as an acoustoelectric element, and a process for production of said semiconductor.

SUMMARY OF THE INVENTION

According to the present invention there is provided a piezoelectric semiconductor comprising a single crystal composed mainly of ZnO, which has an electrical conductivity of $10^{-11} \sim 10^{-3}$ 1/Ω·cm, preferably $10^{-6} \sim 10^{-3}$ 1/Ω·cm, more preferably $10^{-5} \sim 10^{-4}$ 1/Ω·cm.

This piezoelectric semiconductor produces both an AE voltage and a piezoelectric voltage (hereinafter referred to as PE voltage). In order to use the piezoelectric semiconductor as an acoustoelectric element, it is therefore necessary to eliminate the PE voltage using a frequency filter. To enable the separation of the two voltages by a frequency filter, the ratio of AE voltage: PE voltage is preferably at least 3:1. In order to obtain such a voltage ratio, the mobility (carrier mobility) of the piezoelectric semiconductor is preferably at least 30 cm$^2$/V·sec.

In order for the above piezoelectric semiconductor to act as a better acoustoelectric element, it is preferable that the voltage ratio be at least 9:1 and, in order to obtain such a voltage ratio, for the mobility be at least 60 cm$^2$/V·sec.

The above piezoelectric semiconductor has a variation in electrical conductivity in ZnO single crystal, of preferably 10$^2$ 1/Ω·cm or less, more preferably 10$^1$ 1/Ω·cm or less so that it has uniform acoustoelectric property and produces a stable electrical power.

According to the present invention there is also provided, as a first process for producing a piezoelectric semiconductor, a process for producing a piezoelectric semiconductor, which comprises placing sintered ZnO as a raw material in the raw material section of a vessel located at the vessel bottom and ZnO seed crystals in the crystal growth section of the vessel located at the vessel top, feeding an alkali solvent into the vessel, and placing the vessel under hydrothermal conditions with the temperature inside the vessel being controlled so that the temperature of the raw material section becomes higher than the temperature of the crystal growth section, to grow a ZnO single crystal, in which process 0.02 to less than 0.1 mole of $H_2O_2$ is added to each 1 liter of the alkali solvent to allow the resulting ZnO single crystal to have a controlled electrical conductivity of preferably $10^{-6} \sim 10^{-3}$ 1/Ω·cm.

In the above process, by adding a given concentration (about 0.02–0.1 mole) of $H_2O_2$ to each 1 liter of the alkali solvent, the electrical conductivity of the ZnO single crystal obtained is controlled at a value appropriate for an acoustoelectric element. This advantage has been brought about as a result of the study by the present inventor.

In the above process, the electrical conductivity can be controlled at $10^{-4} \sim 10^{-5}$ 1/Ω·cm by adding 0.06–0.08 mole of $H_2O_2$ to each 1 liter of the alkali solvent.

According to the present invention, there is also provided, as a second process for producing a piezoelectric semiconductor, a process for producing a piezoelectric semiconductor, which comprises placing sintered ZnO as a raw material in the raw material section of a vessel located at the vessel bottom and ZnO seed crystals in the crystal growth section of the vessel located at the vessel top, feeding an alkali solvent into the vessel, and placing the vessel under hydrothermal conditions with the temperature inside the vessel being controlled so that the temperature of the raw material section becomes higher than the temperature of the crystal growth section, to grow a ZnO single crystal, in which process the resulting ZnO single crystal is doped with Li and consequently has a controlled electrical conductivity.

In the above process, a ZnO single crystal having an electrical conductivity of as high as $10^{-2} \sim 10^{0}$ 1/Ω·cm, obtained by a conventional process, can be made into a ZnO single crystal having an electrical conductivity of $10^{-6} \sim 10^{-3}$ 1/Ω·cm which is suitable as an acoustoelectric element. Further in the above process, since no $H_2O_2$ is required, it is not necessary to use a vessel for single crystal growth, made of expensive platinum or a vessel whose inside is lined with platinum, which makes low the production cost of ZnO single crystal.

According to the present invention, there is also provided, as a third process for producing a piezoelectric semiconductor, a process for producing a piezoelectric semiconductor, which comprises placing sintered ZnO as a raw material in the raw material section of a vessel located at the vessel bottom and ZnO seed crystals in the crystal growth section of the vessel located at the vessel top, feeding an alkali solvent into the vessel, and placing the vessel under hydrothermal conditions with the temperature inside the vessel being controlled so that the temperature of the raw material section becomes higher than the temperature of the crystal growth section, to grow a ZnO single crystal, in which process $H_2O_2$ is added to the alkali solvent and the resulting ZnO single crystal is doped with a trivalent metal to allow the ZnO single crystal to have a controlled electrical conductivity.

In the above process, a ZnO single crystal having an electrical conductivity of about $10^{-10} \sim 10^{-8}$ 1/Ω·cm, obtained by a conventional process can be made into a ZnO single crystal having an electrical conductivity of $10^{-6} \sim 10^{-3}$ 1/Ω·cm which is very suitable for use as an acoustoelectric element.

In improving the electrical conductivity of a ZnO single crystal having an electrical conductivity of $10^{-10} \sim 10^{-8}$ 1/Ω·cm by vapor-depositing Zn on the surface of said single crystal to achieve a state of excess Zn, improvement in electrical conductivity is obtained only in the vapor-deposited surface and its vicinity, and the resulting ZnO single crystal has no overall uniformity in electrical conductivity. Such disadvantage can be avoided in the above third process of the present invention. Vapor deposition requires large equipment and results in a high cost. This disadvantage can also be avoided in the present third process.

According to the present invention, there is also provided, as a fourth process for producing a piezoelectric semiconductor, a process for producing a piezoelectric semiconductor, which comprises placing sintered ZnO as a raw material in the raw material section of a vessel located at the vessel bottom and ZnO seed crystals in the crystal growth section of the vessel located at the vessel top, feeding an alkali solvent containing $NH_4^+$, into the vessel, and placing the vessel under hydrothermal conditions with the temperature inside the vessel being controlled so that the temperature of the raw material section becomes higher than the temperature of the crystal growth section, to grow a ZnO single crystal, in which process $H_2O_2$ is added to the alkali solvent to allow the resulting ZnO single crystal to have a controlled electrical conductivity.

In this fourth process, a ZnO single crystal having an electrical conductivity of about $10^{-11} \sim 10^{-6}$ 1/Ω·cm can be obtained.

As mentioned above, a ZnO single crystal having an electrical conductivity of $10^{-10} \sim 10^{-8}$ 1/Ω·cm is obtainable according to a conventional process. However, its application as an acoustoelectric element is not known.

In the conventional process, $Li^+$, which is contained in the alkali solvent, enters into the ZnO single crystal formed, as an impurity. In this ZnO single crystal having a very low electrical conductivity, the impurity present therein has a large influence on the mobility of the single crystal and, in some cases, reduces the mobility significantly. This reduction in mobility tends to reduce the acoustoelectric effect of the ZnO single crystal.

Further, when $Li^+$ displaces Zn atom(s) and enters into the crystal lattice points of ZnO, $Li^+$ acts as an acceptor and reduces the electrical conductivity of the ZnO single crystal; meanwhile, when $Li^+$ enters between the crystal lattice points of ZnO, $Li^+$ acts as a donor and increases the electrical conductivity of the ZnO single crystal. In this case, $Li^+$ may be unevenly distributed in the ZnO single crystal formed, depending upon the manner in which $Li^+$ enters. The uneven distribution invites variation in electrical conductivity and, therefore, use of such a ZnO single crystal as an acoustoelectric element is not preferable.

In the fourth process of the present invention, an alkali solvent containing $NH_4^+$ in place of $Li^+$ is used and $NH_4^+$ does not enter into the ZnO crystal. Therefore, there occurs no problem as mentioned above and there can be produced a ZnO single crystal suitable as an acoustoelectric element.

The reason why $NH_4^+$, unlike $Li^+$, does not enter into the ZnO crystal, is presumed to be that $NH_4^+$ has a much larger ionic radius than $Li^+$.

$NH_4^+$, similarly to $Li^+$, promotes the growth of ZnO crystal in an axis "a" direction.

In each of the above first to fourth processes, the total amount of heavy metals present as impurities in sintered ZnO as raw material is controlled preferably at 0.01 wt % or less, more preferably 0.001 wt % or less for improved mobility. The total amount is 0.01 wt % or less in order to obtain a mobility of 30 cm²/V·sec or more and 0.001 wt % or less in order to obtain a mobility of 60 cm²/V·sec or more.

With respect to the temperature difference ΔT between the raw material section and the crystal growth section, the (ΔT) in the latter half of the growth period is preferably controlled at 70% or less of the ΔT in the former half of the growth period, because it can achieve a variation in electrical conductivity in single crystal, of $10^2$ 1/Ω·cm or less. The ΔT in the latter half is more preferably controlled at 35% or less of the ΔT in the former half, because it can achieve a variation in electrical conductivity in single crystal, of $10^1$ 1/Ω·cm or less.

DETAILED DESCRIPTION OF PREFERRED EMBODIMENTS

Figure 1:
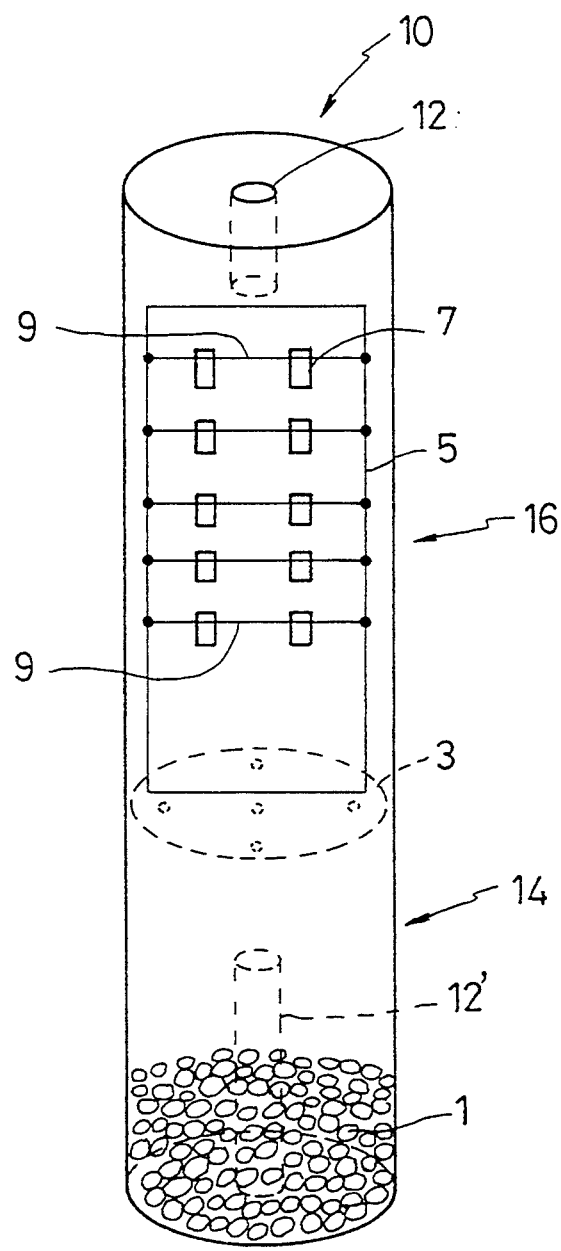
FIG. 1 is a schematic perspective view showing an example of the vessel for crystal growth according to the present invention.

Description is made below on the piezoelectric semiconductor of the present invention.

The piezoelectric semiconductor of the present invention is constituted by a single crystal composed mainly of ZnO, and has an electrical conductivity of $10^{-11} \sim 10^{-3}$ 1/Ω·cm. The piezoelectric semiconductor having an electrical conductivity of said range can produce such a voltage as to make said semiconductor usable as an acoustoelectric element.

In view of the level and stability of the above voltage produced, a piezoelectric semiconductor having an electrical conductivity of $10^{-6} \sim 10^{-3}$ 1/Ω·cm is more suitable for use as an acoustoelectric element, and a piezoelectric semiconductor having an electrical conductivity of $10^{-5} \sim 10^{-4}$ 1/Ω·cm is even more suitable.

The piezoelectric semiconductor having an electrical conductivity of $10^{-11}$ to less than $10^{-6}$ 1/Ω·cm produces a slightly smaller voltage than the piezoelectric semiconductor having an electrical conductivity of $10^{-6} \sim 10^{-3}$ 1/Ω·cm. A piezoelectric semiconductor of the present invention produced by using an alkali solvent containing $Li^+$ is usable as an acoustoelectric element although it tends to have problems of mobility and variation in electrical conductivity owing to the presence of $Li^+$ as mentioned above.

Then, a description is made of the first process for producing the piezoelectric semiconductor of the present invention.

First, sintered ZnO, which is a raw material for growing a ZnO single crystal, is produced according to a conventional method. Of the sintered ZnO particles, those having diameters of about 1-2 mm are preferably used selectively.

Then, the sintered ZnO is placed into a vessel for the growth of ZnO single crystal, whose inside is lined with a noble metal. This vessel may be wholly made of a noble metal (the noble metal is preferably Pt when $H_2O_2$ is used). As necessary, a baffle is placed in the vessel to divide the vessel inside into (a) a raw material section filled with the sintered ZnO and (b) a crystal growth section in which ZnO seed crystals are to be placed. Thereafter, ZnO seed crystals are placed at the top of the vessel (in the crystal growth section when the baffle is used). Into the vessel is poured an alkali solvent containing 2-6 moles/liter of KOH and 1-3 moles/liter of LiOH, mixed with about 0.02-0.1 mole, per liter of the alkali solvent, of $H_2O_2$. The amount of the alkali solvent is preferably 60-85% of the vessel's free volume, i.e. the vessel's residual volume when the sintered ZnO, the baffle, etc. have been placed in the vessel.

Then, the vessel for crystal growth is placed in other container, for example, an autoclave, and the autoclave is filled with a pressure medium to immerse the vessel for crystal growth in the pressure medium. The pressure medium can be any substance as long as it has weak corrosivity at high temperatures and at high pressures, and distilled water is preferred. Such a pressure medium produces a pressure at the crystal growth temperature, said pressure differing depending upon the filling degree of the pressure medium relative to the residual internal volume (hereinafter referred to as free internal volume) of the autoclave when the crystal growth vessel has been placed in the autoclave. This pressure acts so as to protect the crystal growth vessel when the filling degree of the pressure medium is controlled so that the pressure of the medium becomes the same as or slightly higher than the pressure inside the crystal growth vessel. When the pressure medium is distilled water, its filling degree is preferably 60-80% of the free internal volume of the autoclave when the above alkali solvent and alkali concentration are used.

Thereafter, the autoclave is placed in a heating furnace to heat the crystal growth vessel to heat the crystal growth section and the raw material section to respective predetermined temperatures. In this case, the temperature of the crystal growth section is lower than that of the raw material section by about 5°-25° C. That is, the temperatures of the crystal growth section and the raw material section are preferably 360°-400° C. and 380°-420° C., respectively. This heating condition is continued for 10-30 days for crystal growth, after which the operation of the heating furnace is stopped for cooling to room temperature and the resulting ZnO single crystal is taken out.

In the production of sintered ZnO by firing, the heavy metals present as impurities in the raw material may be removed beforehand in order to later obtain a ZnO single crystal of improved mobility.

A ZnO single crystal, when used as an acoustoelectric element, preferably has a mobility of a given value or more, that is, 30 cm²/cm·sec or more. ZnO single crystals produced by conventional processes have had a low mobility in some cases owing to the presence of impurities (e.g. Pb) therein. While Pb is present in a ZnO powder in an amount of about 50 ppm, a high-purity ZnO powder can be produced by repeating Zn distillation to obtain high-purity Zn and using this high-purity Zn for ZnO production.

The variation in electrical conductivity in ZnO single crystal can be made $10^2$ 1/Ω·cm or smaller by controlling the temperature difference ΔT between the crystal growth section and the raw material section so that the ΔT in the latter half of the crystal growth period becomes smaller than the ΔT in the former half. For example, the ΔT in the former half is controlled at 10°-25° C. and the ΔT in the latter half is controlled at 5°-10° C. The variation in electrical conductivity can also be made small by changing the above ΔT not only in two stages but also in multistages and continuously depending upon the conditions of crystal growth.

Next, a description is made of the second process for producing the piezoelectric semiconductor of the present invention.

In this second process, the growth of ZnO single crystal, the control of mobility in ZnO single crystal and the control of variation in electrical conductivity in ZnO single crystal are conducted in the same manner as in the first process with the exception that the alkali solvent contains no $H_2O_2$, that is, the alkali solvent contains only 2-6 moles/liter of KOH and 1-3 moles/- liter of LiOH. Since no $H_2O_2$ is used, the crystal growth vessel inside need not be lined with expensive platinum and use of relatively inexpensive Ag or the like is sufficient, enabling cost reduction.

The second process has a feature in that the resulting ZnO single crystal undergoes a post-treatment, i.e. doping with Li as described below.

Doping with Li is conducted so that the Li concentration in ZnO single crystal becomes 15-120 ppm, preferably 30-90 ppm. The doping method is not particularly restricted and includes immersion, coating, spraying, etc. each using a LiOH solution. In this case, the concentration of the LiOH solution can appropriately vary depending upon the size, etc. of the single crystal to be treated but, when a ZnO single crystal of 5 mm×5 mm×5 mm is used, it is immersed in 5 ml of a LiOH solution containing 50-200 ppm of Li. The single crystal after immersion is subjected to a diffusion treatment in air or an oxygen current at 800°-1,000° C. for 100-300 hours to complete Li doping.

The reason why a LiOH solution is used, is that the solution is an alkali solution and does not impair the surface crystallinity of the ZnO single crystal in the diffusion treatment and further that only Li enters into the crystal and the diffusion is easy to control. The reason why the diffusion treatment is conducted under the above-mentioned conditions, is to allow the diffusion to take place not only at the crystal surface but also uniformly in the crystal interior.

A description is made of the third process for producing the piezoelectric semiconductor of the present invention.

In the third process, the growth of ZnO single crystal, the control of mobility in ZnO single crystal and the control of variation in electrical conductivity in ZnO single crystal are conducted in the same manner as in the first process with the exception that the alkali solvent contains the same amount (2-6 moles/liter) of KOH and the same amount (1-3 moles/liter) of LiOH but is mixed with $H_2O_2$ of a larger amount than used in the first process, i.e., 0.1 to 0.3 moles per liter of the alkali solvent. The third process has a feature in that the resulting ZnO single crystal undergoes a post-treatment, i.e., doping with a trivalent metal (e.g. Al or In) as mentioned below.

Doping with a trivalent metal is conducted so that the concentration of trivalent metal (e.g., Al) in ZnO single crystal becomes 5-120 ppm, preferably 30-90 ppm. The doping method is not particularly restricted and includes immersion, coating, spraying, etc. each using a solution of a trivalent metal hydroxide or carbonate, for example, an $Al(OH)_3$ or $Al_2(CO_3)_3$ solution. In this case, the concentration of the $Al(OH)_3$ or $Al_2(CO_3)_3$ solution can appropriately vary depending upon the size, etc. of the single crystal to be treated but, when a ZnO single crystal of 5 mm×5 mm×5 mm is used, it is immersed in 5 ml of an $Al(OH)_3$ or $Al_2(CO_3)_3$ solution containing 50-200 ppm of Al.

The single crystal after immersion is subjected to a diffusion treatment in air or an oxygen current at 700°-1,000° C. for 100-500 hours to complete doping with a trivalent metal. The reason why the diffusion treatment is conducted under such conditions, is to allow the diffusion to take place not only at the crystal surface but also uniformly in the crystal interior.

As mentioned above, in doping with Al or the like, Al or the like is allowed to act, in a liquid phase, on a ZnO single crystal and the resulting ZnO single crystal is subjected to a diffusion treatment. Therefore, the apparatus therefor is simple and, as compared with the conventional Zn vapor deposition method, the associated cost is low; moreover, the formed ZnO single crystal has an improved electrical conductivity not only at the crystal surface and its vicinity but also in the whole crystal portion, and further has improved uniformity in electrical conductivity.

Lastly, a description is made of the fourth process for producing the piezoelectric semiconductor of the present invention.

As mentioned above, the fourth process has a feature in that it uses an alkali solvent containing no $Li^+$, unlike the first to third processes, in order to reliably eliminate the adverse effect of $Li^+$ on the mobility and variation in electrical conductivity, of the formed ZnO single crystal having a low electrical conductivity (about $10^{-11} \sim 10^{-6}$ $1/\Omega\cdot cm$).

The fourth process is compared with the first process. Into a crystal growth vessel is poured an alkali solvent containing 2-6 moles/liter of KOH and 0.1-0.5 mole/liter of $NH_4OH$, in place of an alkali solvent containing 2-6 moles/liter of KOH and 1-3 moles/liter of LiOH; and a pressure medium (distilled water) is fed into an autoclave at a filling degree of about 60-80% relative to the free internal volume of the autoclave. The amount of $H_2O_2$ added to the alkali solvent is appropriately 0.1-0.5 mole per liter of the alkali solvent. Other than the above, the fourth process is not different from the first process in the growth of ZnO single crystal, the control of mobility of ZnO single crystal and the control of variation in electrical conductivity of ZnO single crystal.

The present invention is hereinafter described in more detail by way of Examples. However, the present invention is in no way restricted to these Examples.

Examples 1-2

Growth of ZnO Single Crystal 500 g of a high-purity ZnO powder obtained via Zn distillation was mixed with 500 g of distilled water. The mixture was molded into spheres of 2-3 mm in diameter and dried at 100° C. for 2 hours. The dried product was sintered at 1,100° C. for 24 hours in an oxygen atmosphere in an alumina crucible. The sintered ZnO obtained was subjected to sieving to selectively obtain a sintered ZnO having particle diameters of 1-2 mm.

200 g of the sintered ZnO was placed in a crystal growth vessel 10 shown in FIG. 1. This crystal growth vessel 10 had portions 12 and 12' for thermocouple insertion, had a roughly cylindrical shape of 30 mm in inside diameter and 300 mm in height, had an internal volume of 250 ml, and was lined with Pt at the inner wall.

Then, a baffle 3 that opening was 5% of the cross section area was placed in the crystal growth vessel to separate the inside of the vessel 10 into a raw material section 14 and a crystal growth section 16. In the crystal growth section 16 was placed a Pt frame 5 from which ZnO seed crystals 7 suspended. (The frame 5 was prepared by penetrating a Pt wire 9 (as an example of a noble metal wire) through ZnO seed crystals 7 and fixing the both ends of each of such Pt wires 9 to a frame 5 to fix the seed crystals 7 to the frame 5.)

Into the crystal growth vessel 10 was poured an alkali solvent containing 3 moles/liter of KOH and 1.5 moles/liter of LiOH. At that time, the alkali solvent was mixed with $H_2O_2$ of a concentration shown in Table 1. The amount of the alkali solvent (mixed with $H_2O_2$) poured was 80% of the free internal volume of the crystal growth vessel 10.

Figure 2:
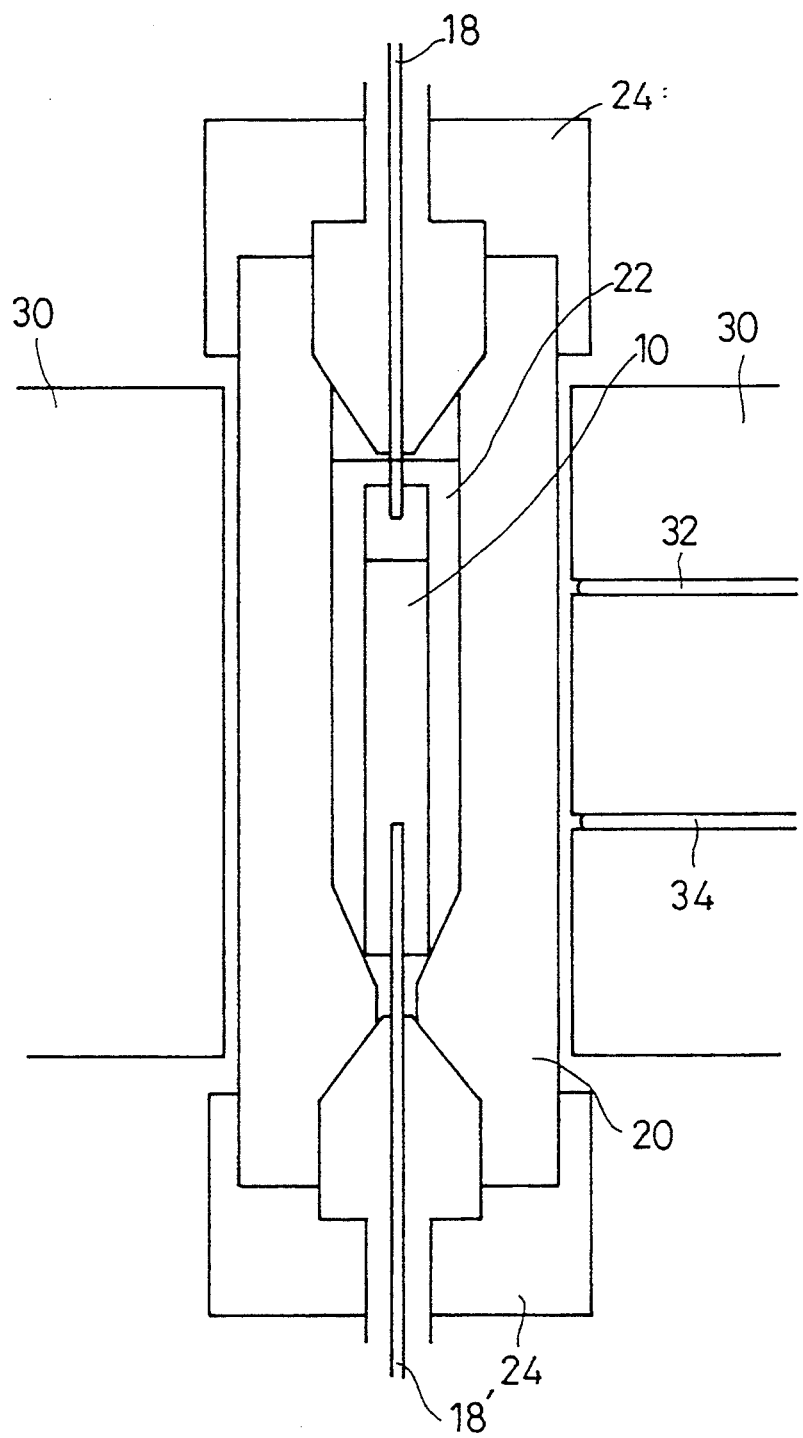
FIG. 2 is a schematic sectional view showing an example of the apparatus for crystal growth according to the present invention.

Then, the crystal growth vessel 10 was placed in an autoclave 20, as shown in FIG. 2. Thermocouples 18 and 18' were arranged at the respective places. Distilled water 22 was poured into the autoclave 20. The amount of distilled water 20 poured was 70% of the free internal volume of the autoclave 20.

Thereafter, the autoclave 20 was sealed with caps 24 and placed in an electrical furnace 30. The electrical furnace 30 had two stages (upper and lower stages) for enabling the fine control of crystal growth temperatures and was provided with thermocouples 32 and 34. Temperature elevation was conducted so that the temperature of the crystal growth section 16 was always lower than the temperature of the raw material section 14, whereby the crystal growth section was heated to 380° C. or the raw material section was heated to 395° C. This heating state was kept for 20 days, after which the electrical furnace was cooled to room temperature and the resulting ZnO single crystal was taken out. Incidentally, as shown in Table 1, the difference in temperature ($\Delta T$) between the crystal growth section and the raw material section was made smaller in the latter half (10 days) of the heating (crystal growth) period than in the former half (10 days) in order to make small the variation in electrical conductivity in the ZnO single crystal formed.

Performance Evaluation

Each of the thus-obtained ZnO single crystals was measured for electrical conductivity and its variation, mobility and acoustoelectric effect. The results are shown in Table 1.

The acoustoelectric effect was measured as follows.

Measurement of Acoustoelectric Effect

A ZnO single crystal was processed into a cube of 5 mm×5 mm×5 mm so that the top and bottom surfaces of the cube were each the face "c" of the single crystal. Onto either of these two surfaces was perpendicularly applied an ultrasonic pulse having a given energy. The resulting voltage was separated into an AE voltage and a PE voltage using a frequency filter, and the wave shape of only the PE voltage was observed and an absorption coefficient was calculated therefrom.

The "absorption coefficient" indicates an efficiency when an ultrasonic energy is converted into an electrical energy. A larger absorption coefficient gives a larger acoustoelectric effect.

Figure 3:
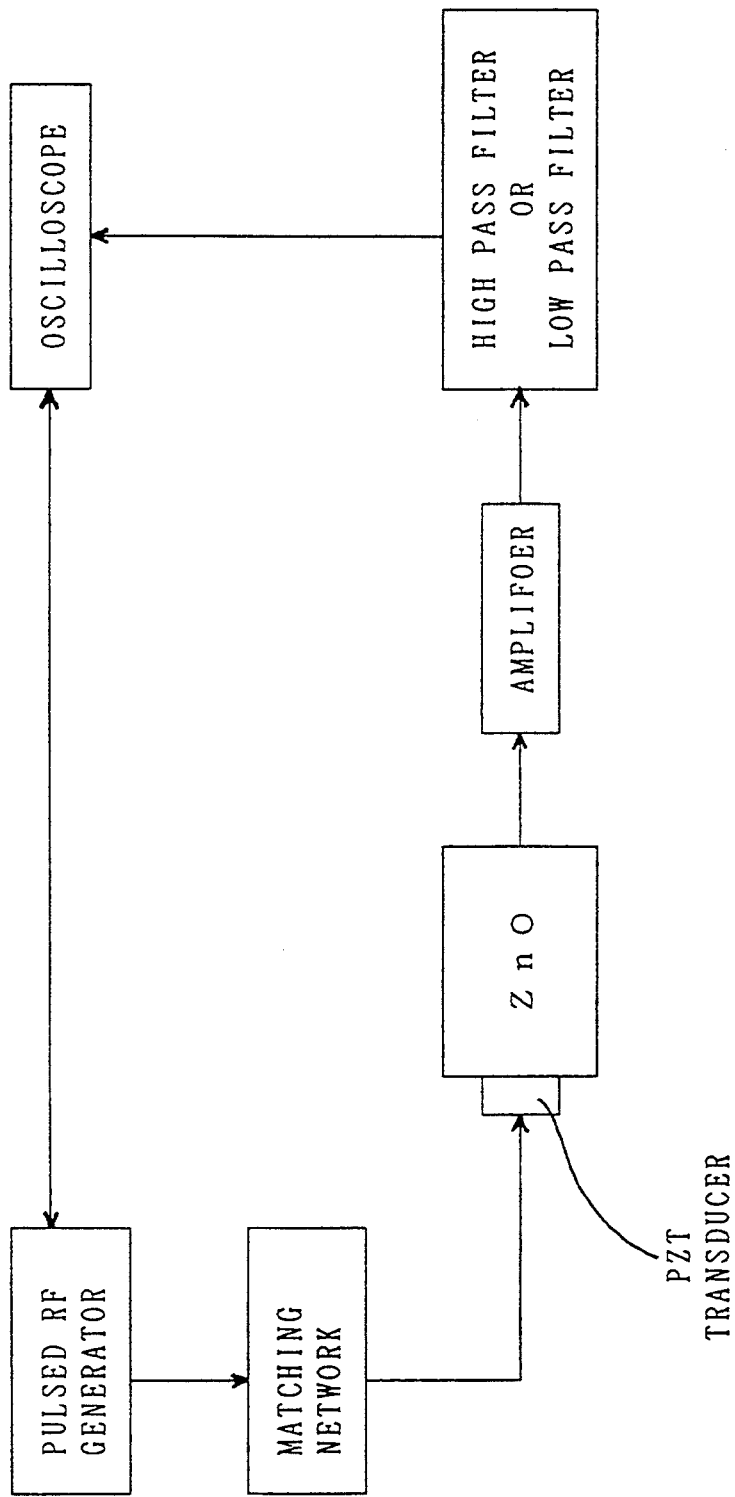
FIG. 3 is a schematic drawing showing an apparatus for measuring the AE voltage and PE voltage of a ZnO single crystal.

A schematic drawing of the tester used for the measurement of acoustoelectric effect is shown in FIG. 3.

Examples 3-4

Growth of ZnO Single Crystal

The same operation as in Examples 1-2 was conducted with the exception that no $H_2O_2$ was used, the inside of the crystal growth vessel 10 was lined with Ag, and the frame 5 was made of Ag. The resulting ZnO single crystal was doped with Li as follows.

Doping with Li

The ZnO single crystal obtained above. was immersed in a LiOH solution of given concentration and then subjected to a diffusion treatment in an oxygen current at 850° C. for 240 hours. In Table 1 are shown the Li concentration in LiOH solution, the Li concentration (doped amount) in ZnO single crystal, etc.

Performance Evaluation

The ZnO single crystal doped with Li was measured for performances including acoustoelectric effect in the same manners as in Examples 1-2. The results are shown in Table 1.

Examples 5-6

Growth of ZnO Single Crystal

The same operation as in Examples 1-2 was conducted with the exception that the amount of $H_2O_2$ used was increased slightly. The resulting ZnO single crystal was doped with Al as follows.

Doping with Al

The ZnO single crystal obtained above was immersed in an $Al(OH)_3$ solution of given concentration and then subjected to a diffusion treatment in an oxygen current at 700°-1,000° C. for 100-500 hours. In Table 1 are shown the Al concentration in $Al(OH)_3$ solution and the Al concentration (doped amount) in ZnO single crystal.

Performance Evaluation

The ZnO single crystal doped with Al was measured for performances including acoustoelectric effect in the same manners as in Examples 1-2. The results are shown in Table 1.

Examples 7-8

Growth of ZnO Single Crystal

The same operation as in Examples 1-2 was conducted with the exception that there was used an alkali solvent containing 3 moles/liter of KOH and 0.3 mole/liter of $NH_4OH$ and that $H_2O_2$ of a concentration shown in Table 1 was added to each 1 liter of the alkali solvent.

Performance Evaluation

The ZnO single crystal obtained above was measured for performances including acoustoelectric effect in the same manners as in Examples 1-2. The results are shown in Table 1.

TABLE 1

| | $H_2O_2$ Concent. (mole/l) | $\Delta T$ (°C.) Former half | $\Delta T$ (°C.) Latter half | Concentration of heavy metals (impurities) in sintered ZnO (wt. %) | Post-treatment Concentration of Li or trivalent, metal in solution (ppm) | Post-treatment Concentration of Li or trivalent metal in crystal (ppm) | Electrical conductivity (1/ $\Omega \cdot$ cm) | Mobility ($cm^2/$ V · sec) | Variation in electric conductivity (1/ $\Omega \cdot$ cm) | Acoustoelectric effect* $V_{AE}$ (V) | $V_{AE}/V_{PE}$ |
|---|---|---|---|---|---|---|---|---|---|---|---|
| Example | | | | | | | | | | | |

TABLE 1-continued

| | $H_2O_2$ Concent. (mole/l) | $\Delta T$ (°C.) Former half | $\Delta T$ (°C.) Latter half | Concentration of heavy metals (impurities) in sintered ZnO (wt. %) | Post-treatment Concentration of Li or trivalent, metal in solution (ppm) | Post-treatment Concentration of Li or trivalent metal in crystal (ppm) | Electrical conductivity (1/ $\Omega \cdot$ cm) | Mobility ($cm^2$/ V $\cdot$ sec) | Variation in electric conductivity (1/ $\Omega \cdot$ cm) | Acoustoelectric effect* $V_{AE}$ (V) | Acoustoelectric effect* $V_{AE}/V_{PE}$ |
|---|---|---|---|---|---|---|---|---|---|---|---|
| 1 | 0.08 | 15 | 5 | 0.0001 | — | — | $1 \times 10^{-5}$ | 120 | $10^{0.5}$ | 2.7 | 30 |
| 2 | 0.07 | 15 | 5 | 0.0005 | — | — | $1 \times 10^{-4}$ | 100 | $10^{0.5}$ | 1.8 | 20 |
| 3 | — | 15 | 5 | 0.0001 | Li 140 | Li 50 | $1 \times 10^{-5}$ | 85 | $10^{0.5}$ | 1.7 | 19 |
| 4 | — | 15 | 5 | 0.0003 | Li 100 | Li 45 | $1 \times 10^{-4}$ | 75 | $10^{1}$ | 1.4 | 16 |
| 5 | 0.20 | 15 | 5 | 0.0001 | Al 70 | Al 30 | $1 \times 10^{-5}$ | 110 | $10^{0.5}$ | 1.7 | 19 |
| 6 | 0.20 | 15 | 5 | 0.0003 | Al 90 | Al 40 | $1 \times 10^{-4}$ | 95 | $10^{0.5}$ | 2.1 | 23 |
| 7 | 0.10 | 15 | 5 | 0.0001 | — | — | $1 \times 10^{-7}$ | 100 | $10^{1}$ | 1.1 | 12 |
| 8 | 0.30 | 15 | 5 | 0.0001 | — | — | $1 \times 10^{-9}$ | 85 | $10^{1}$ | 1.0 | 11 |

*$V_{AE}$: Acoustoelectric Voltage.
$V_{AE}/V_{PE}$: Ratio of acoustoelectric voltage to piezoelectric voltage. (There voltages are each a value when the applied ultrasonic energy was 1 W/$cm^2$.)

As described above, the present invention can provide a piezoelectric semiconductor having properties (e.g. electrical conductivity) suitable for use as an acoustoelectric element, by adding a given amount of $H_2O_2$ to the alkali solvent, or by using $NH_4OH$ in the alkali solvent, or by doping the ZnO single crystal with Li or a trivalent metal.

Accordingly, the piezoelectric semiconductor can be suitably used as a ultrasonic transducer material of acoustoelectric type and can also be used as a material for ultrasonic amplification, an surface acoustic wave filter, a piezoelectric transducer, a fluorescent material for emitting a low-velocity electron beam, etc.

What is claimed is:

1. A piezoelectric semiconductor for use as an acoustoelectric element comprising a single crystal composed mainly of ZnO, said single crystal having an electrical conductivity of $10^{-11} \sim 10^{-6}$ 1/$\Omega \cdot$cm, a carrier mobility of at least 30 $cm^2$/V$\cdot$sec, and a variation in electrical conductivity in said single crystal of $10^2$ 1/$\Omega \cdot$cm or smaller.

2. The piezoelectric semiconductor of claim 1, wherein said carrier mobility is at least 60 $cm^2$/V$\cdot$sec.

3. A piezoelectric semiconductor for use as an acoustoelectric element comprising a single crystal composed mainly of ZnO, said single crystal having an electrical conductivity of $10^{-6} \sim 10^{-3}$ 1/$\Omega \cdot$cm, a carrier mobility of at least 30 $cm^2$/V$\cdot$sec, and a variation in electrical conductivity in said single crystal of $10^2$ 1/$\Omega \cdot$cm or smaller.

4. The piezoelectric semiconductor of claim 3, wherein the electrical conductivity is $10^{-5} \sim 10^{-4}$ 1/$\Omega \cdot$cm.

5. The piezoelectric semiconductor of claim 3, wherein said single crystal is doped with 15-120 ppm of Li.

6. The piezoelectric semiconductor of claim 3, wherein said single crystal is doped with 5-120 ppm of a trivalent metal.

7. The piezoelectric semiconductor of claim 6, wherein the trivalent metal is selected from the group consisting of Al and In.

8. The piezoelectric semiconductor of claim 3, wherein said carrier mobility is at least 60 $cm^2$V$\cdot$sec.

* * * * *